United States Patent
Koh

(10) Patent No.: US 8,531,099 B2
(45) Date of Patent: Sep. 10, 2013

(54) ORGANIC LIGHT EMITTING DIODE DISPLAY

(75) Inventor: Byung-Sik Koh, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 168 days.

(21) Appl. No.: 13/067,087

(22) Filed: May 6, 2011

(65) Prior Publication Data

US 2012/0043894 A1  Feb. 23, 2012

(30) Foreign Application Priority Data

Aug. 19, 2010  (KR) .................. 10-2010-0080397

(51) Int. Cl.
 *H01J 1/62* (2006.01)
 *H01J 63/04* (2006.01)
(52) U.S. Cl.
 USPC ............................ 313/498; 313/504; 313/506
(58) Field of Classification Search
 USPC ................................................ 313/498–512
 See application file for complete search history.

(56) References Cited

U.S. PATENT DOCUMENTS

| | | | |
|---|---|---|---|
| 2007/0236428 A1* | 10/2007 | Tseng et al. | 345/81 |
| 2007/0257250 A1 | 11/2007 | Tseng et al. | |
| 2008/0224128 A1* | 9/2008 | Kim et al. | 257/40 |
| 2010/0123127 A1* | 5/2010 | Inoue et al. | 257/40 |
| 2011/0215712 A1* | 9/2011 | Hong | 313/504 |

FOREIGN PATENT DOCUMENTS

| | | |
|---|---|---|
| KR | 10-2006-0082476 A | 7/2006 |
| KR | 10-2008-0041951 A | 5/2008 |
| KR | 10-2009-0106757 A | 10/2009 |

* cited by examiner

*Primary Examiner* — Anh Mai
*Assistant Examiner* — Kevin Quarterman
(74) *Attorney, Agent, or Firm* — Lee & Morse, P.C.

(57) ABSTRACT

An organic light emitting diode (OLED) display includes a substrate, an organic light emitting element including a first electrode, an organic emission layer, and a second electrode on the substrate, a driving thin film transistor turning on/off first power supplied to the first electrode and including a first active layer including zinc oxide (ZnO), a photo sensor disposed between the substrate and the organic emission layer and including a second active layer sensing light emitted from the organic emission layer, and a controller controlling at least one of the first power and a second power supplied to the second electrode according to the intensity of the light sensed by the photo sensor.

8 Claims, 3 Drawing Sheets

ORGANIC LIGHT EMITTING DIODE DISPLAY

BACKGROUND

1. Field

The described technology relates generally to an organic light emitting diode (OLED) display. More particularly, the described technology relates generally to an OLED display having a photo sensor.

2. Description of the Related Art

An organic light emitting diode (OLED) display has been recently spotlighted as a display device for displaying images.

The OLED display has a self luminous efficiency, and differs from a liquid crystal display (LCD) in that it does not require a separate light source, and bears relatively small thickness and weight. Furthermore, the organic light emitting diode display exhibits high quality characteristics such as low power consumption, high luminance and short response time.

An OLED display includes a substrate, an organic light emitting element having a first electrode formed on the substrate, an organic emission layer disposed on the first electrode, and a second electrode disposed on the organic emission layer, and at least one thin film transistor that turns on/off power supplied to the organic light emitting element.

The above information disclosed in this Background section is only for enhancement of understanding of the background of the described technology and therefore it may contain information that does not form the prior art that is already known in this country to a person of ordinary skill in the art.

SUMMARY

One aspect of the described technology provides an organic light emitting diode (OLED) display including a substrate, an organic light emitting element including a first electrode, an organic emission layer, and a second electrode that are formed on the substrate, a driving thin film transistor that turns on/off first power supplied to the first electrode, and including a first active layer including zinc oxide (ZnO), a photo sensor disposed between the substrate and the organic emission layer, and including a second active layer that senses light emitted from the organic emission layer, and a controller controlling at least one of the first power and a second power supplied to the second electrode according to an intensity of light sensed by the photo sensor.

The second active layer may include amorphous silicon.

The OLED display may further include a switching thin film transistor that turns on third power that controls the driving thin film transistor and including a third active layer.

The third active layer may include the same material as the first active layer.

The third active layer may include with the same material as the second active layer.

The photo sensor may further include a sensor input end and a sensor output end contacting respective ends of the second active layer and a sensing thin film transistor connected with the sensor input end.

The OLED display may further include a light blocking layer disposed between the second active layer and the substrate.

The light blocking layer may contact the second active layer.

The light blocking layer may include at least one of titanium nitride ($TiN_x$) and aluminum nitride ($AlN_x$).

According to one of the above-described exemplary embodiments, the sensing characteristic of the photo sensor that senses light and the driving efficiency of the thin film transistor are improved so that the luminous efficiency of the organic light emitting element and the driving efficiency of the thin film transistor are improved, thereby providing OLED display having improved display quality.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
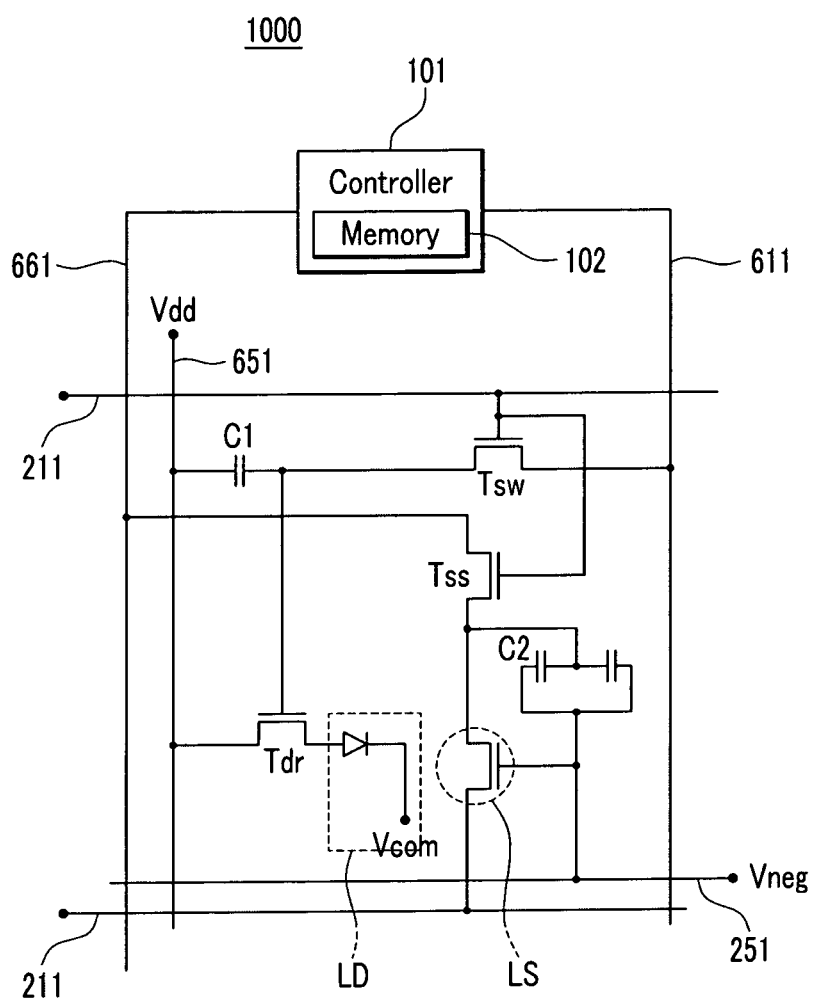
FIG. 1 illustrates a circuit diagram of an organic light emitting diode (OLED) display according to a first exemplary embodiment.

Korean Patent Application No. 10-2010-0080397, filed on Aug. 19, 2010, in the Korean Intellectual Property Office, and entitled: "Organic Light Emitting Diode Display," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, in the specification, "on" implies being positioned above or below a target element and does not imply being necessarily positioned on the top on the basis of a gravity direction. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, an organic light emitting diode (OLED) display 1000 according to a first exemplary embodiment will be described with reference to FIG. 1 and FIG. 2.

FIG. 1 illustrates a circuit diagram of the OLED display according to the first exemplary embodiment.

As shown in FIG. 1, the OLED display 1000 according to the first exemplary embodiment includes a plurality of signal lines 211, 251, 611, 651, and 661 and at least one pixel that can be formed by the signal lines. Here, the pixel is the minimum unit that displays an image.

The signal lines include a gate signal 211 transmitting a scan signal, a negative electrode line 251 applying a negative voltage, a data line 611 transmitting data power that is referred to herein as a "third power", a driving power line 651 transmitting a driving power Vdd that is referred to herein as a "first power", and a sensor line 661 connected with a photo sensor LS.

The pixel includes an organic light emitting element LD, a switching thin film transistor Tsw, a driving thin film transistor Tdr, a sensing thin film transistor Tss, a photo sensor LS, and capacitors C1 and C2.

The driving thin film transistor Tdr has a control terminal, an input terminal, and an output terminal, and the control terminal is connected to the switching thin film transistor Tsw, the input terminal is connected to the driving power line 651, and the output terminal is connected to the organic light emitting element LD. The driving thin film transistor Tdr includes a first active layer, which will be described, below.

The organic light emitting element LD includes a first electrode that may be an anode connected with the output terminal and supplied with the first power Vdd, a second electrode that may be a cathode supplied with second power Vcom, and an organic emission layer disposed between the first and second electrodes. Light emitted from the organic emission layer may be controlled according to the amount of current of at least one of the first power Vdd, which is turned on/off by the driving thin film transistor Tdr and the second power Vcom supplied to the second electrode. The OLED display 1000 displays an image by light emission of the organic light emitting element LD.

The switching thin film transistor Tsw has a control terminal, an input terminal, and an output terminal. The control signal is connected to the gate line 211, the input terminal is connected to the data line 611, and the output terminal is connected to the control terminal of the driving thin film transistor Tdr. The switching thin film transistor Tsw transmits data power applied to the data line 611 according to the scan signal applied to the gate line 211 to the driving thin film transistor Tdr. The switching thin film transistor Tsw includes a third active layer, which will be described below.

The capacitor C1 is connected between the control terminal and the input terminal of the driving thin film transistor Tdr. The capacitor C1 changes and maintains the data power input to the control terminal of the driving thin film transistor Tdr.

Performances of the switching thin film transistor Tsw and the driving thin film transistor Tdr may gradually deteriorate while the switching thin film transistor Tsw and the driving thin film transistor Tdr are being driven. The sensing thin film transistor Tss, the photo sensor LS, the capacitor C2, and the negative electrode line 251 may compensate the deterioration of the switching thin film transistor Tsw and the driving transistor Tdr.

The sensing thin film transistor Tss has a control terminal, an input terminal, and an output terminal. The control terminal is connected to the gate line 211, the input terminal is connected to the sensor line 661, and the output terminal is connected to the photo sensor LS and capacitor C2. The sensing thin film transistor Tss includes a fourth active layer, as will be described below.

The capacitor C2 is connected between the output terminal of the sensing thin film transistor Tss and the negative electrode line 251. The capacitor C2 charges and maintains a voltage input to the input terminal of the sensing thin film transistor Tss.

The photo sensor LS includes the second active layer sensing light emitted from the organic emission layer of the organic light emitting element LD, a sensor input end connected to a first end of the second active layer and the output terminal of the sensing thin film transistor Tss, and a sensor output end connected to a second end of the second active layer and the gate line 211 at the rear end.

The second active layer of the photo sensor LS has a characteristic that resistance is decreased when the second active layer receives light from the organic light emitting element LD, so that a current flows. Thus, when light is incident on the second active layer, the current flows to the sensor output end from the sensor input end so that a charging capacity of the capacitor C2 is decreased. As the intensity of the light that is incident on the second active layer is increased, the amount of current flowing to the sensor output end from the sensor input end is increased so that the capacity decrease of the capacitor C2 is increased and much more current flows through the sensor line 661. Although the same amount of data power is applied, the intensity of the incident light on the second active layer may be decreased or increased according to the degree of deterioration of the switching thin film transistor Tsw and the driving thin film transistor Tdr.

As described, the deterioration of the switching thin film transistor Tsw and the driving thin film transistor Tdr, the intensity of the incident light on the second active layer from the organic light emitting element LD, the intensity of the current flowing to the output end of the photo sensor LS, the capacity decrease of the capacitor C2, and the current supply amount of the sensor line 611 for compensating the capacity decrease of the capacitor C2 are related to each other.

In addition, the controller 101 controls the data power supplied to the data line 611 based on the amount of current supplied through the sensor line 661. The deterioration of the switching thin film transistor Tsw and the driving thin film transistor Tdr may be compensated. The memory 102 connected with the controller 101 stores a supply current amount table through the sensor line 611 according to the intensity of the data power, and the controller 101 compensates the deterioration of the switching thin film transistor Tsw and the driving thin film transistor Tdr with respect to various data power using the memory 102.

Hereinafter, a structure of the pixel in the OLED display of FIG. 1 will be described with reference to FIG. 2 in further detail. For better understanding and ease of description, the plurality of signal lines 211, 251, 611, 651, and 661, the capacitors C1 and C2, the controller 101, and the memory 102 will not be illustrated in FIG. 2.

Figure 2:
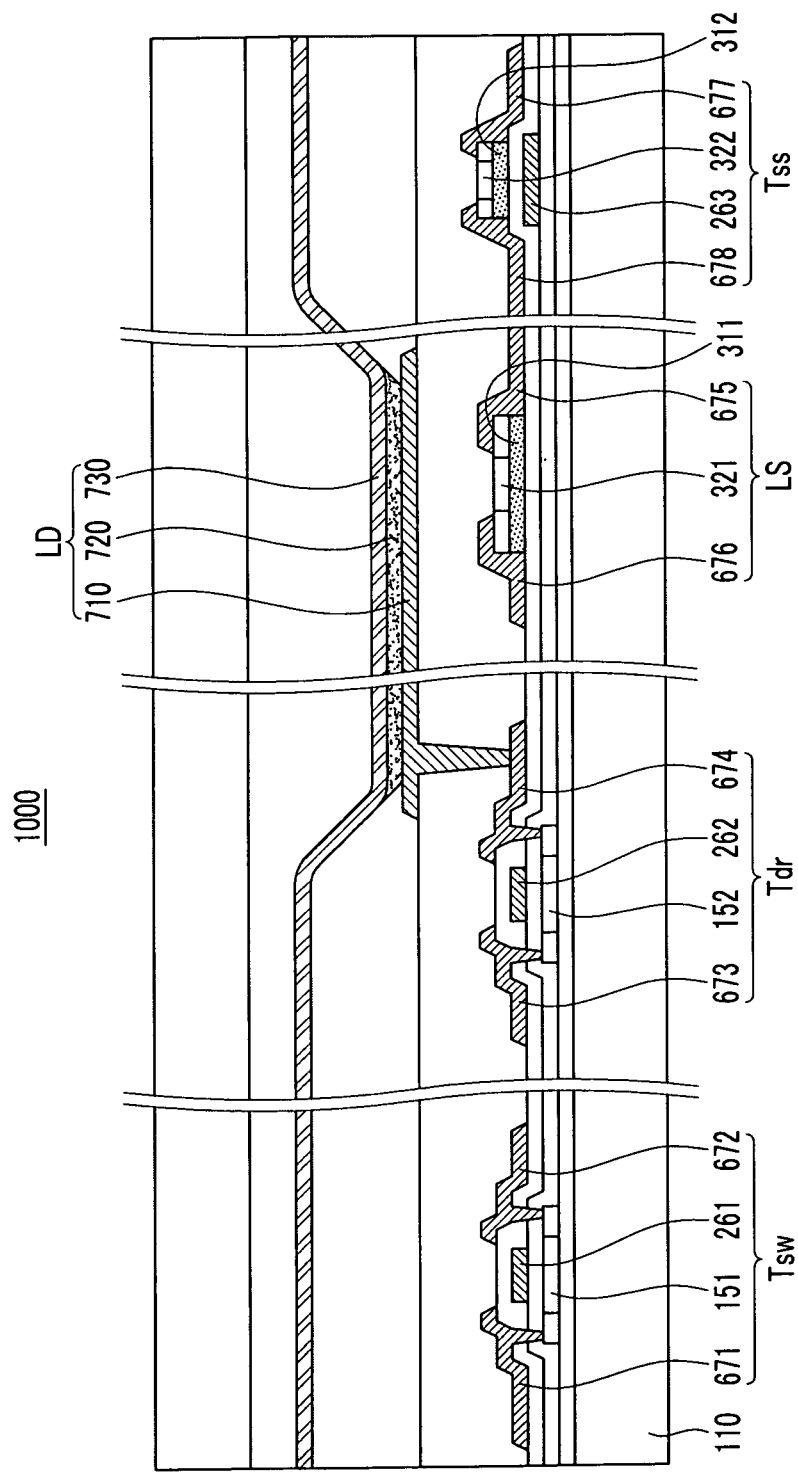
FIG. 2 illustrates a cross-sectional view of the OLED display according to the first exemplary embodiment.

FIG. 2 illustrates a cross-sectional view of an OLED display according to the first exemplary embodiment.

As shown in FIG. 2, the switching thin film transistor Tsw, the driving thin film transistor Tdr, the organic light emitting element LD, the photo sensor LS, a light blocking layer 311, and a sensing thin film transistor Tss are formed on a substrate 110 including at least one of glass, a resin, and a metal.

The switching thin film transistor Tsw includes a third active layer 151 as a control terminal, a switching source electrode 671 as an input terminal, contacting both ends of a switching gate electrode 261 and the third active layer 151, and a switching drain electrode 672 as an output terminal.

The third active layer 151 is formed with the same material of a first active layer 152 of a driving thin film transistor Tdr, and is a semiconductor layer including zinc oxide ZnO. Generally, a semiconductor layer including zinc oxide has a higher semiconductor characteristic compared to a semiconductor layer formed with amorphous silicon. The third active layer 151 includes zinc oxide so that the driving efficiency of the switching thin film transistor Tsw may be further improved. The third active layer 151 may be formed of the semiconductor layer formed with zinc oxide, but the third active layer 151 according to another exemplary embodiment may be formed of a semiconductor formed with zinc oxide that is doped with an ion of an element such as indium (In), gallium (Ga), or tin (Sn). That is, since the third active layer 151 is formed with an oxide semiconductor layer having the zinc oxide as a main component, mobility, uniformity, and reliability of the switching thin film transistor Tsw may be further improved compared to a conventional switching thin film transistor having amorphous silicon as a main component so that luminous efficiency of the OLED display 1000 may be improved. When the third active layer 151 is formed of an oxide semiconductor layer including zinc oxide, the third active layer 151 may be formed through an existing low temperature polysilicon (LIPS) process equipment, and accordingly, the third active layer 151 may be formed at a low temperature below 300° C. so that the manufacturing cost of the OLED display 1000 can be reduced.

The switching gate electrode 261 is connected with a gate line 211, the switching source electrode 671 is connected with a data line 611, and the switching drain electrode 672 is connected with a driving gate electrode 262 of the driving thin film transistor Tdr. As a signal supplied through the data line 611, third power, which is a data signal, is turned on/off by the switching thin film transistor Tsw to control the driving thin film transistor Tdr.

The driving thin film transistor Tdr includes a first active layer 152 as a control terminal, a driving source electrode 673 as an input terminal contacting both ends of the driving gate electrode 262 and the first active layer 152, and a driving drain electrode 674 as an output terminal.

Like the third active layer 151 of the switching driving thin film transistor Tdr, the first active layer 152 may be a semiconductor layer including zinc oxide. That is, the first active layer 152 of the driving thin film transistor Tdr may be formed simultaneously when the third active layer 151 of the first active layer 152 is formed. As described, since the first active layer 152 may include zinc oxide, the driving efficiency of the driving thin film transistor Tdr may be improved. The first active layer 152 may be formed of a semiconductor layer including zinc oxide as a main component, but the first active layer 152 according to another exemplary embodiment may be formed of a semiconductor layer including zinc oxide doped with an ion of an element such as indium (In), gallium (Ga), or tin (Sn). That is, since the first active layer 152 may be formed of the oxide semiconductor layer including zinc oxide as a main component, mobility, uniformity, and reliability of the driving thin film transistor Tdr may be further improved compared to a conventional driving thin film transistor having amorphous silicon as a main component so that luminous efficiency of the OLED display 1000 may be improved. In addition, when the first active layer 152 is formed of an oxide semiconductor layer including zinc oxide, the first active layer 152 may be formed through an existing LIPS process equipment, and accordingly, the first active layer 152 may be formed at a low temperature below 300° C. so that the manufacturing cost of the OLED display 1000 may be reduced.

The driving gate electrode 262 is connected with the switching drain electrode 672 of the switching thin film transistor Tsw, the driving source electrode 673 is connected with the driving power line 651, and the driving drain electrode 674 is connected with the first electrode 710 of the organic light emitting element LD. As a signal supplied through the driving power line 651, the first power, which is a driving power, is turned on/off by the driving thin film transistor Tdr and then supplied to a first electrode 710 of the organic light emitting element LD.

The organic light emitting element LD includes the first electrode 710, an organic emission layer 720 formed on the first electrode 710, and a second electrode 730 formed on the organic emission layer 720.

The first electrode 710 may be an anode that is a hole injection electrode and the second electrode 730 may be a cathode that is an electron injection electrode. However, the first exemplary embodiment is not limited thereto, and according to a driving method of the OLED display 1000, the first electrode 710 may be a cathode and the second electrode 730 may be an anode. In this case, the driving power may be supplied to the cathode and the common power may be supplied to the anode. When first power Vdd is supplied to the first electrode 710 and second power Vcom is supplied to the second electrode 730, holes and electrodes are injected into the organic emission layer 720 respectively from the first and second electrodes 710 and 730, and emission of light from the organic emission layer 720 occurs when the excitons, being the combinations of the injected holes and electrodes, drop from the excited state to the ground state.

The second electrode 730 is formed as one layer over the pixel.

In addition, the first electrode 710 and the second electrode 730 may include a single or double light reflective conducting material or a light transflective conducting material including at least one of molybdenum (Mo), aluminum (Al), silver (Ag), indium tin oxide (ITO), and indium zinc oxide (IZO). As described, at least one of the first and second electrodes 710 and 730 of the organic light emitting diode 70 in the OLED display 1000 according to the first exemplary embodiment may include a light transflective conducting material, and light emitted from the organic emission layer 270 to a direction of the at least one of first and second electrodes 710 and 720, including the transflective conducting material may be emitted to the outside such that a front emission type, rear emission type, or dual emission type OLED display 1000 can be provided. The OLED display 1000 according to the first exemplary embodiment is a rear emission type such that light is emitted to a direction of the substrate 110.

The photo sensor LS is disposed between the substrate 110 and the organic light emitting element LD, and senses light emitted from the organic emission layer 720. The photo sensor LS includes a second active layer 321 as a sensing and controlling terminal, a sensor input end 675 as an input terminal, and a sensor output end 676 as an output terminal.

The second active layer 321 may be a semiconductor layer including amorphous silicon. The semiconductor layer including the amorphous silicon may have a high light sensing capability compared to a semiconductor layer including zinc oxide. The second active layer 321 may include the amorphous silicon so that the light sensing capability of the photo sensor LS can be improved. If the second active layer 321 is formed of the semiconductor layer including the amorphous silicon as a main component, resistance of the second active layer 321 may be further sensitively changed according to the intensity of light received from the organic emission layer 720 as compared to a photo sensor that has a semiconductor layer having the zinc oxide as a main component. As described, the photo sensor LS further sensitively senses light emitted from the organic emission layer 720 of the organic light emitting element LD so that the capacity decrease of the capacitor C2 and the current supply amount of the sensor line 661 for compensating the capacity decrease of the capacitor C2 are further sensitively controlled to thereby minimize deterioration of the switching thin film transistor Tsw and the driving thin film transistor Tdr.

The sensor input terminal 675 is connected with the sensing drain electrode 678 of the sensing thin film transistor Tss, and the sensor output end 676 is connected with the gate line 211 at the rear end. When the second active layer 321 is activated by light emitted from the organic light emitting element LD, the current supplied to the sensor input end 675 from the sensor line 661 through the sensing thin film transistor Tss is transmitted to the sensor output terminal 676 through the second active layer 321. The intensity of the current transmitted to the sensor output terminal 676 may vary according to the intensity of the light emitted from the organic light emitting element LD.

The light blocking layer 311 is disposed between the second active layer 321 and the substrate 110, and prevents external light from being incident on the second active layer 321 of the photo sensor LS. Particularly, the light blocking layer 311 contacts the second active layer 321, and may include at least one of titanium nitride ($TiN_x$) and aluminum nitride ($AlN_x$). For example, when $TiCl_4$ as a titanium precursor or $AlCl_3$ as an aluminum precursor is mixed with source gas (e.g., $SiH_4+N_2+NH_3$) and the mixture is vapor-deposited on an insulating layer formed with silicon nitride ($SiN_x$), the light blocking layer 311 including opaque titanium nitride ($TiN_x$) or aluminum nitride ($AlN_x$) is formed such that light from only the organic light emitting element LD is irradiated to the photo sensor LS.

The sensing thin film transistor Tss includes a fourth active layer 322 as a control terminal, a sensing source electrode 677 as an input terminal contacting both ends of the sensing gate electrode 263 and the fourth active layer 322, and a sensing drain electrode 678 as an output terminal.

Like the second active layer 321 of the photo sensor LS, the fourth active layer 322 may be a semiconductor layer including amorphous silicon. The fourth active layer 322 forming the sensing thin film transistor Tss may be simultaneously formed when the second active layer 321 is formed. A first dummy layer 312 including the same material of the light blocking layer 311 may be disposed between the fourth active layer 322 and the substrate 110.

The sensing gate electrode 263 is connected with the gate line 211, the sensing source electrode 677 is connected with the sensor line 661, and the sensing drain electrode 678 is connected with the sensor input end 675 of the photo sensor LS.

Hereinafter, a function of the photo sensor LS will be described with reference to FIG. 1 and FIG. 2.

When a gate-on voltage is applied through the gate line 211, the switching thin film transistor Tsw and the sensing thin film transistor Tss are turned on. The capacitor C2 is charged while the sensing thin film transistor Tss is in the turn-on state. While the switching thin film transistor Tsw is in the turn-on state, a third power, which is data power applied through the data line 611, is transmitted to the switching drain electrode 672. The third power is applied to the driving gate electrode 262 of the driving thin film transistor Tdr so that the driving thin film transistor Tdr is turned on. The first power, which is the driving power, is applied to the driving drain electrode 674 through the driving thin film transistor Tdr in the turn-on state. The size of the first power is determined by the third power, which is the data power. The driving power applied to the driving drain electrode 674 is applied to the first electrode 710 such that the organic emission layer 720 emits light. Light emitted from the organic emission layer 720 activates the second active layer 321 so that the current flows to the sensor output end 676 from the sensor input end, and accordingly, the capacity of the capacitor C2 is decreased. In this case, in order to charge the capacitor C2 again, the controller 101 controls the third power (i.e., data power), and accordingly the driving efficiency of the driving thin film transistor Tdr and the switching thin film transistor Tsw may be improved, thereby improving the luminous efficiency of the organic light emitting element LD. The display quality of the OLED display 1000 may be improved.

The luminous efficiency of the organic light emitting element LD may be improved by improvement of the driving efficiency of the driving thin film transistor Tdr and the switching thin film transistor Tsw, Accordingly, the deterioration of the switching thin film transistor Tsw, the driving thin film transistor Tdr, and the organic light emitting element LD may be suppressed so that the life-span of the OLED display 1000 may be improved.

As described, the third active layer 151 and the first active layer 152 of the switching thin film transistor Tsw and the driving thin film transistor Tdr of the OLED display 1000 according to the first exemplary embodiment, requiring excellent semiconductor characteristics, may be formed of semiconductor layers including zinc oxide having an excellent semiconductor characteristic and the second active layer 321 of the photo sensor LS requiring an excellent light sensing characteristic is formed of a semiconductor layer including amorphous silicon having an excellent light sensing characteristic so that the driving efficiencies of the driving thin film transistor Tdr and the switching thin film transistor Tsw may be improved and simultaneously the luminous efficiency of the organic light emitting element LD may be improved, thereby improving the display quality of the OLED display 1000.

Hereinafter, an OLED display 1002 according to a second exemplary embodiment will be described with reference to FIG. 3.

Figure 3:
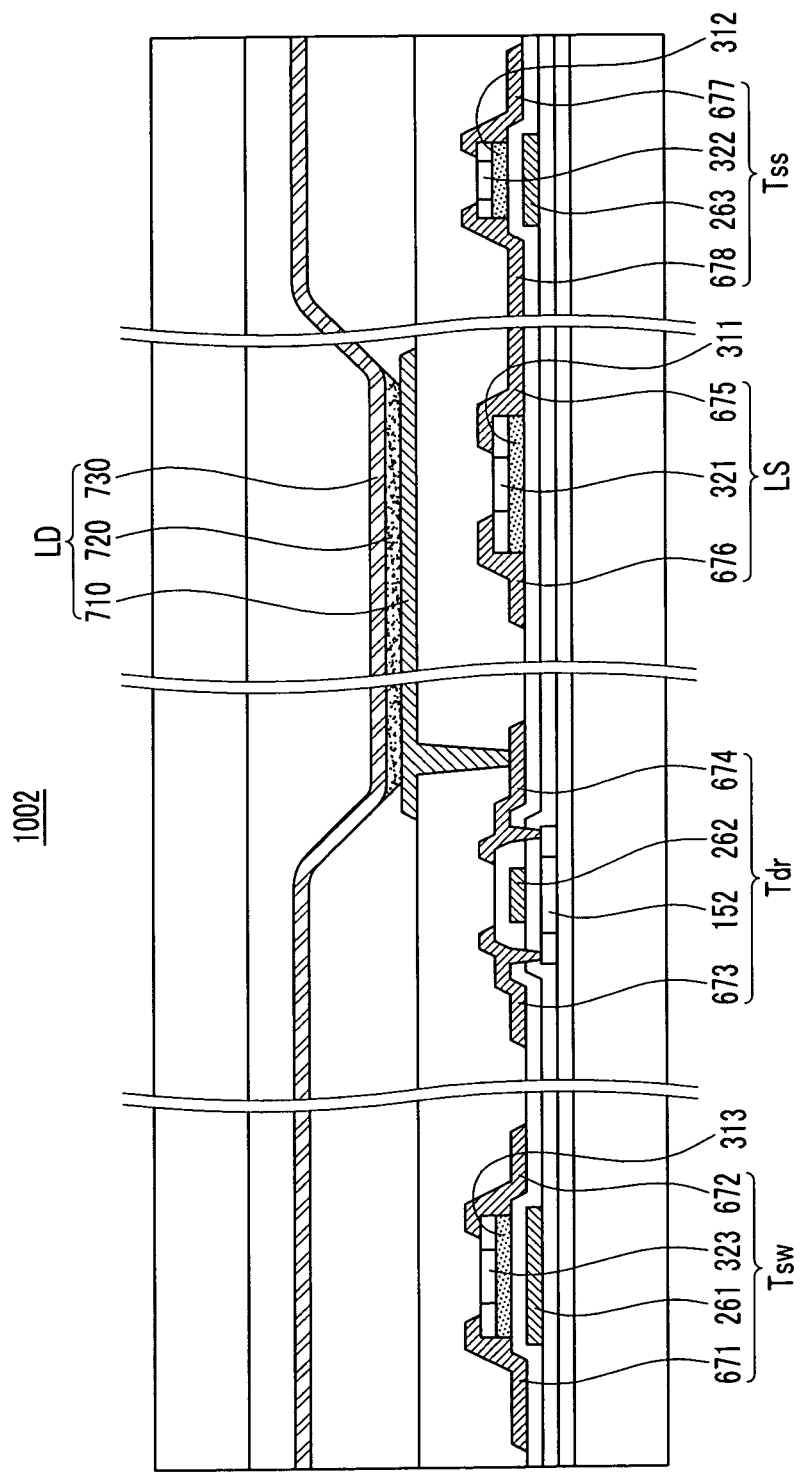
FIG. 3 illustrates an OLED display according to a second exemplary embodiment.

FIG. 3 illustrates a cross-sectional view of the OLED display according to the second exemplary embodiment.

As shown in FIG. 3, a third active layer 323 of a switching thin film transistor Tsw of the OLED display 1002 according to the second exemplary embodiment may be formed with a material that is the same as a second active layer 321 of a photo sensor LS and a fourth active layer 322 of a sensing thin film transistor Tss, and may be a semiconductor layer including amorphous silicon. A second dummy layer 313 including the same material of a light blocking layer 311 may be disposed between the third active layer 323 and a substrate 110.

As described, the first active layer 152 of the driving thin film transistor Tdr of the OLED display 1002 according to the second exemplary embodiment, requiring an excellent semiconductor characteristic, may be formed of a semiconductor layer including zinc oxide having an excellent semiconductor characteristic and the second active layer 321 of the photo sensor LS requiring an excellent photo sensing characteristic may be formed of a semiconductor layer including amorphous silicon having an excellent light sensing characteristic so that the driving efficiency of the driving thin film transistor Tdr may be improved and simultaneously the luminous efficiency of the organic light emitting element LD may be improved, thereby improving the display quality of the OLED display 1002.

By way of summation and review, an active layer included in a thin film transistor may have a problem in that the active layer may deteriorate when used for a long period of time, thereby causing luminous efficiency to be unstable. The technology described above may provide an organic light emitting diode (OLED) display, the display quality of which may be improved by improving the luminous efficiency of an organic light emitting element and driving efficiency of a thin film transistor.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting diode (OLED) display comprising:
    a substrate;
    an organic light emitting element including a first electrode, an organic emission layer, and a second electrode on the substrate;
    a driving thin film transistor that turns on/off first power supplied to the first electrode, and including a first active layer including zinc oxide (ZnO);
    a photo sensor disposed between the substrate and the organic emission layer, and including a second active layer that senses light emitted from the organic emission layer, the photo sensor including a sensor input end and a sensor output end contacting respective ends of the second active layer,
    a sensing thin film transistor connected with the sensor input end of the photo sensor; and
    a controller controlling at least one of the first power and a second power supplied to the second electrode according to an intensity of light sensed by the photo sensor.

2. The OLED display as claimed in claim 1, wherein the second active layer includes amorphous silicon.

3. The OLED display as claimed in claim 2, further comprising a switching thin film transistor that turns on a third power that controls the driving thin film transistor and including a third active layer.

4. The OLED display as claimed in claim 3, wherein the third active layer includes the same material as the first active layer.

5. The OLED display as claimed in claim 3, wherein the third active layer includes the same material as the second active layer.

6. The OLED display as claimed in claim 1, further comprising a light blocking layer disposed between the second active layer and the substrate.

7. The OLED display as claimed in claim 6, wherein the light blocking layer contacts the second active layer.

8. The OLED display as claimed in claim 6, wherein the light blocking layer comprises at least one of titanium nitride ($TiN_x$) and aluminum nitride ($AlN_x$).

* * * * *